United States Patent [19]
Tanaka et al.

[11] Patent Number: 5,282,167
[45] Date of Patent: Jan. 25, 1994

[54] DYNAMIC RANDOM ACCESS MEMORY

[75] Inventors: Hiroaki Tanaka, Yokohama; Masaru Koyanagi, Tokyo, both of Japan

[73] Assignee: Kabushiki Kaisha Toshiba, Kawasaki, Japan

[21] Appl. No.: 813,674

[22] Filed: Dec. 26, 1991

[30] Foreign Application Priority Data

Dec. 27, 1990 [JP] Japan ................ 2-418765

[51] Int. Cl.⁵ .............................................. G11C 7/02
[52] U.S. Cl. ................................ 365/206; 365/189.01; 365/201
[58] Field of Search ................... 365/206, 203, 189.09, 365/201

[56] References Cited

U.S. PATENT DOCUMENTS

| | | | |
|---|---|---|---|
| 4,168,490 | 9/1979 | Stinehelfer | 365/206 |
| 4,602,355 | 7/1986 | Watanabe | 365/206 |
| 4,610,002 | 9/1986 | Kaneko | 365/206 |
| 4,943,949 | 7/1990 | Yamaguchi et al. | 365/206 |
| 4,980,862 | 12/1990 | Foss | 365/203 |

FOREIGN PATENT DOCUMENTS 59-500840 4/1983 Japan .
60-235455 5/1984 Japan .

Primary Examiner—Eugene R. LaRoche
Assistant Examiner—Son Dinh
Attorney, Agent, or Firm—Banner, Birch, McKie & Beckett

[57] ABSTRACT

A DRAM according to the invention has noise-eliminating circuits. Each of the circuits has an output side thereof connected to a corresponding word line. At the time of a voltage stress examination, each of the circuits is controlled to be in an on-state thereby transmitting a voltage stress, input an input side thereof, to the word line. At the time of normal operation, the input side of the circuit is connected to an earth node, and each of the circuits is turned on and off in accordance with a signal output from a corresponding one of word line-selecting circuits or with the level of a corresponding one of the word lines.

19 Claims, 6 Drawing Sheets

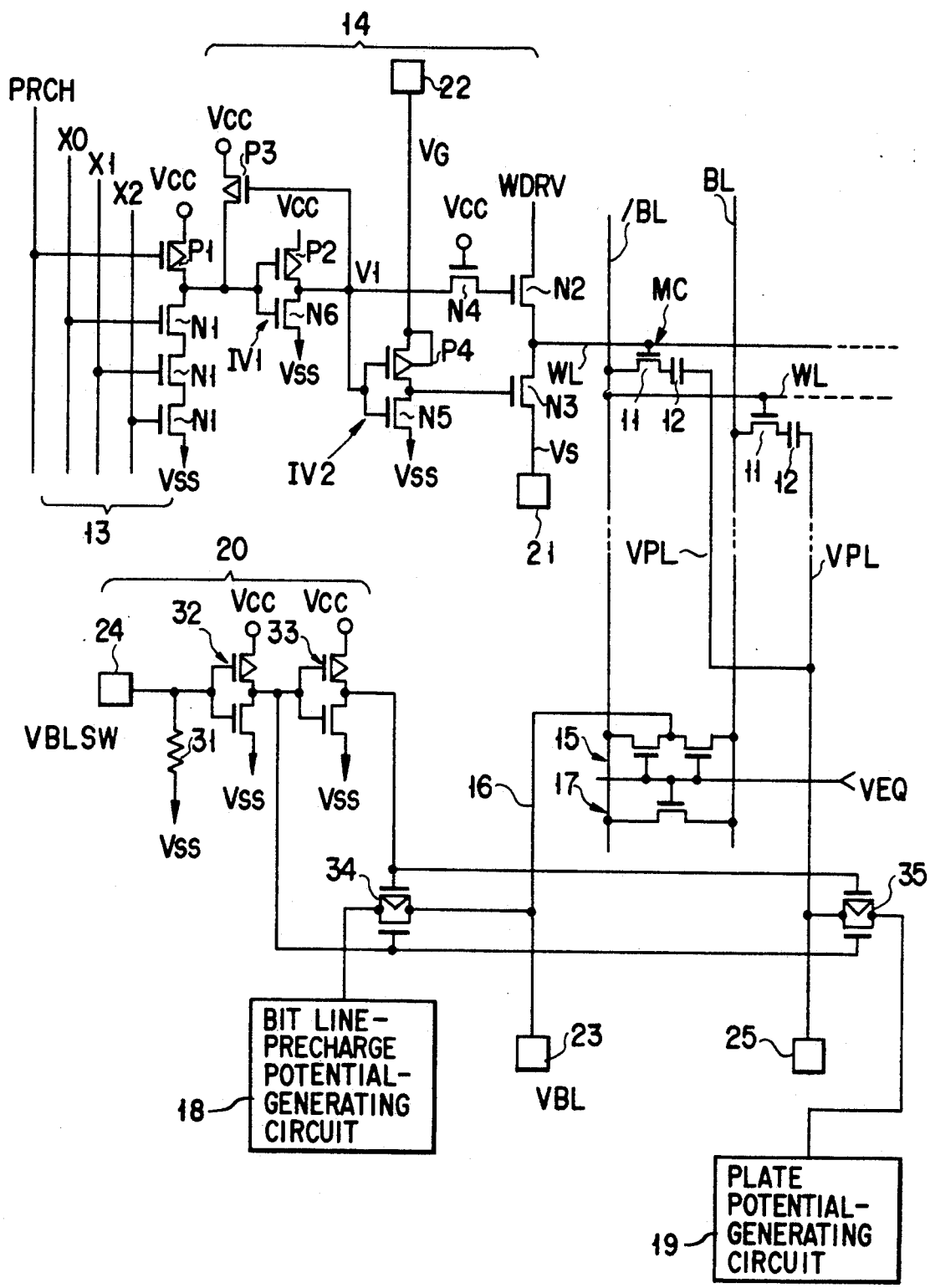
F I G. 1

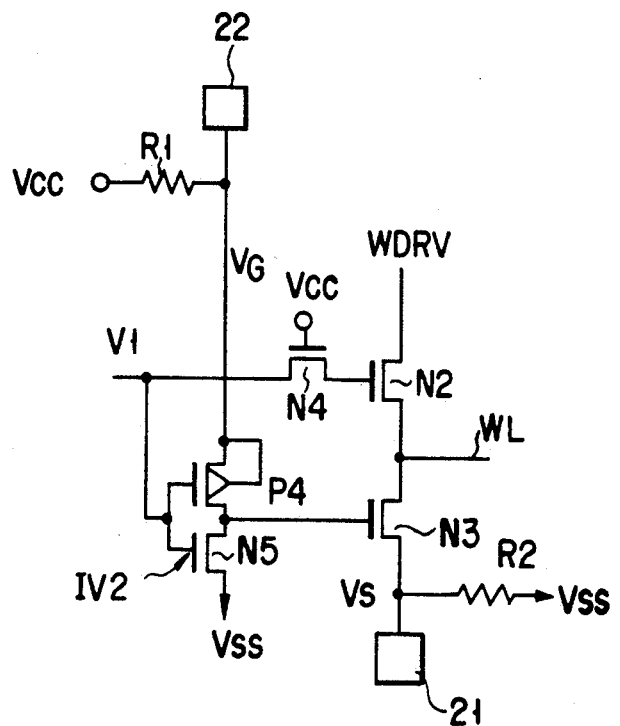
F I G. 2

DYNAMIC RANDOM ACCESS MEMORY

BACKGROUND OF THE INVENTION

1. Field of the Invention

This invention relates to a Dynamic Random Access Memory (DRAM), and particularly to a DRAM having a stress testing means for applying a voltage stress, e.g., when defect screening is performed in a wafer state (i.e., the DRAM which is not separated from a semiconductor wafer).

2. Description of the Related Art

In a manufacturing process of semiconductor devices, in general, products are sorted into good ones and bad ones by a die-sorting test after a process for producing semiconductor wafers, and thereafter the good ones are accommodated in packages, thereby obtaining their final form. The packaged products are screened. This screening is performed so as to expose latent defectiveness in the products, thereby eliminating defective products and enhancing the reliability of the products. As a method of screening, burn-in is employed in many cases, in which electric-field acceleration and temperature acceleration can be simultaneously performed.

Published Unexamined Japanese Patent Application (Kokai) No. 3-35491 (corresponding to U.S. application Ser. No. 544,614) discloses a semiconductor memory suitable in a case where memory cells in a wafer stage are screened using a probe card and a prober before they are subjected to a die-sorting process. Each memory chip region of the semiconductor memory can be effectively screened in a short time.

Further, in many semiconductor memories, a noise-eliminating MOS transistor is connected between the connection node of each word line and an earth node. This transistor is provided for preventing the potential of a non-selected word line from floating in a precharge period or in an active period during normal operation of the memories, thereby preventing the level of the word line from exceeding the threshold voltage of the transfer gate transistor of a memory cell, and hence preventing the data of the memory cells from being lost.

When a voltage stress is applied to all the word lines selected at the time of screening, if the noise-eliminating transistor is on, a pass current will flow to the earth node from a voltage stress power source via the word lines and the noise-eliminating transistor.

Therefore, it is necessary to employ control means for controlling the noise-eliminating transistor, so as to simultaneously apply the voltage stress to all the word lines at the time of the voltage stress examination of a DRAM.

Further if a MOS transistor for the voltage stress examination is provided at the other end of each word line, the required chip area will be increased. Thus, it is desirable to minimize the area of that part of the chip region which is required for performing the voltage stress examination.

SUMMARY OF THE INVENTION

It is the object of the invention to provide a DRAM in which a voltage stress can be simultaneously applied to all the word lines or to word lines more than selected during normal operation thereof, a pass current to an earth node can be prevented from flowing from a voltage stress power source to an earth node via a noise-eliminating circuit, and the increase of the required chip area due to a voltage stress examination can be minimized.

To attain the above object, the DRAM of the invention includes noise-eliminating circuits each having a first terminal thereof connected to an end of a corresponding one of word lines, the noise-eliminating circuits corresponding to all the word lines or to word lines in addition to those selected during normal operation of the memory being turned on at the time of the voltage stress examination, so as to transfer a voltage stress, supplied from a second terminal of each noise-eliminating circuit, to the word lines, the noise-eliminating circuits each having the second terminal thereof connected to an earth node during normal operation, the noise-eliminating circuits being turned on and off by the signals output from word line-driving circuits or by the voltage levels of the word lines.

According to the DRAM, the noise-eliminating circuit is turned on at the time of the voltage stress examination, thereby transferring a voltage stress from a voltage stress power source arranged at the second terminal of the circuit, to the word line, and the second terminal of the circuit is connected to an earth node during normal operation, so that the noise-eliminating circuit is turned on and off by a signal output from a word line-driving circuit or by the voltage level of the word line. Thus, the noise-eliminating circuit operates both at the time of the voltage stress examination and during normal operation of the memory. For example, at the time of a voltage stress examination performed when a DRAM in a wafer stage is subjected to screening, a voltage stress of e.g. direct current can be simultaneously applied to all the word lines or to word lines more than selected during normal operation, thereby enhancing the efficiency of the screening.

In this case, the noise-eliminating circuit is used as voltage stress-transferring means, which prevents a pass current from flowing to the earth node via the noise eliminating circuit. Further, since the noise-eliminating circuit is used both at the voltage stress examination and during normal operation, the area of that part of the chip region which is required for performing the voltage stress examination can be minimized.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a circuit diagram, showing a part of a DRAM according to a first embodiment of the invention;

FIG. 2 is a circuit diagram, showing a variation of the circuit of FIG. 1;

DETAILED DESCRIPTION OF THE PREFERRED EMBODIMENTS

Figure 3:
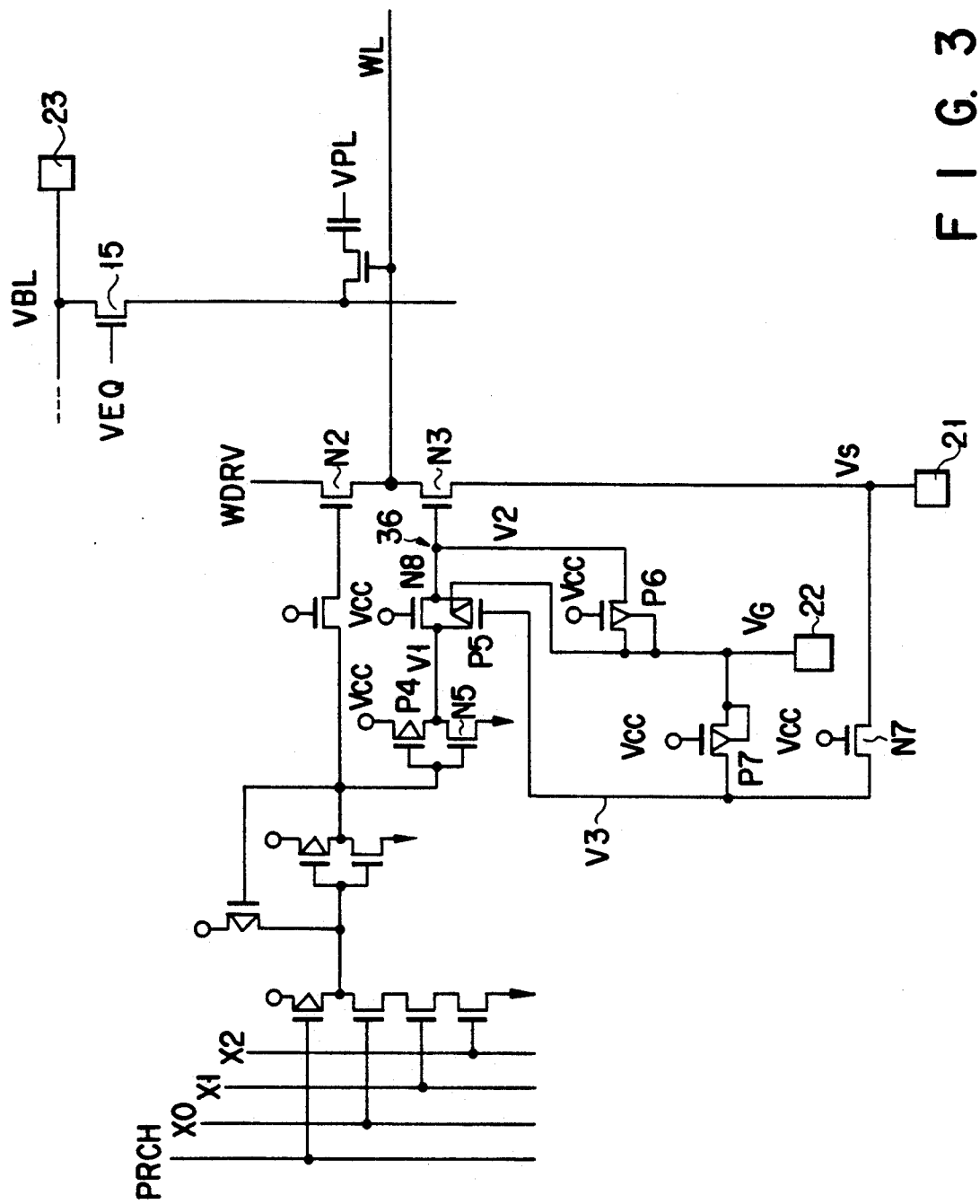
FIG. 3 is a circuit diagram, showing another variation of the circuit of FIG. 1.

The invention will be explained with reference to the accompanying drawings showing embodiments thereof. The same reference numeral through the drawings denotes the same element, and duplicate explanation will be avoided.

FIG. 1 shows a part of a DRAM according to a first embodiment of the invention. A memory cell array incorporated in the DRAM comprises a plurality of dynamic memory cells (DRAM cells) MC (only two of which are shown) arranged in rows and columns, a plurality of word lines WL (only two of which are shown) for selecting the rows of the memory cell array, and a plurality of bit lines (only a complementary pair BL and /BL are shown). A MOS (memory cell) transistor 11 for a transfer gate and a capacitor 12 for storing data are connected in series to each of the memory cells MC. The word line WL is connected to the gates of the cell transistors 11 arranged in a row. The bit lines BL are connected to the drains of the cell transistors 11 arranged in a column, while the bit line /BL is connected to the drains of the cell transistors 11 arranged in another column.

Reference numeral 13 denotes a word line-selecting circuit (row decoder) for outputting a word line selection signal in accordance with an address signal supplied from the outside or inside, reference numeral 14 a word line-driving circuit, and reference numeral 15 a bit line precharge circuit connected between the bit lines BL and /BL and a bit line-precharge power source line 16, and controlled by a bit line-precharge signal VEQ. Reference numeral 17 designates a bit line-equalizing circuit connected between the bit lines BL and /BL and controlled by the bit line-equalizing signal (precharge signal) VEQ. Reference numeral 18 denotes a bit line-precharge potential-generating circuit for supplying a bit line-precharge voltage VBL (generally VCC/2) to all the bit line-precharge power source lines 16, and reference numeral 19 a plate potential-generating circuit for supplying a capacitor plate potential VPL (generally VCC/2) to the capacitor plates of all the memory cells.

Reference 21 denotes a first pad (e.g. bonding pad) to be used for a voltage stress examination, which is connected to an earth potential (VSS) node during normal operation of the DRAM, and to which a stress voltage VS is supplied from the outside at the time of the voltage stress examination.

Reference 22 denotes a second pad for the voltage stress examination, which is connected to a power source potential (VCC) node during normal operation, and to which a gate control voltage VG is supplied from the outside at the time of the voltage stress examination.

In the embodiment, a precharge-type NAND gate is used as the word line-selecting circuit 13. The NAND gate comprises a p-type MOS transistor P1 for precharge and n-type MOS transistors N1 for decoding an inner address signal (e.g. X0–X2), which are connected in series between the power source potential VCC and the earth potential VSS. The junction between the transistors P1 and N1 is the output node of the NAND gate.

In the word line-selecting circuit 13, after the level of the precharge signal PRCH becomes "L" in a state in which the address signals X0–X2 are at "L" level, thereby precharging the output node to "H" level, the level of the signal at the output node (word line-selecting signal) falls to "L" if the levels of all the address signals X0–X2 rise to "H".

The word line-driving circuit 14 comprises, in the embodiment, an n-type MOS transistor N2 for driving a word line, an n-type MOS transistor N3 for eliminating noise, a first CMOS inverter IV1, a p-type MOS transistor P3 for pull-up, an n-type MOS transistor N4, and a second CMOS inverter IV2.

The word line-driving transistor N2 is connected between a word line-driving power source WDRV (having a potential more than the VCC potential) and the word line WL, and drives the word line WL in response to a signal output from the word line-selecting circuit 13. The noise-eliminating transistor N3 has a first terminal thereof connected to an end of the word line WL close to the transistor N2. The first CMOS inverter IV1 comprises a p-type MOS transistor P2 and another n-type MOS transistor N6. The pull-up transistor P3 is connected between the power source potential VCC and the output terminal of the word line-selecting circuit 13, and has its gate connected to the output terminal of the first inverter IV1. The transistor N4 is connected between the output terminal of the first inverter IV1 and the gate of the word line-driving transistor N2, and has its gate supplied with the power source potential VCC. The second inverter IV2 comprises a p-type MOS transistor P4 and an n-type MOS transistor N5, which are connected between the output terminal of the first inverter IV1 and the gate of the noise-eliminating transistor N3.

In the embodiment, the second terminal of each of the noise-eliminating transistors N3 is connected to the first pad 21, not to the inner line VSS. Thus, during normal operation, the first pad 21 is connected to VSS node, and each transistor N3 is turned on and off in accordance with the output signal of a corresponding one of the word line-selecting circuits 13, while at the time of the voltage stress examination, transistors N3 corresponding to all the word lines or to word lines in addition to those selected during normal operation are turned on, thereby transferring a voltage stress, supplied from the second terminal of the respective noise-eliminating circuits, to the word lines.

Further, the p-type MOS transistor P4 of the second inverter IV2 and the second pad 22 cooperate to turn on the transistor N3 at the time of the voltage stress examination. The substrate (n-type well; source) of the transistor P4 is connected to the second pad 22, and the substrate (n-type well) of the transistor P4 is separated from another n-type well. Thus, the source of the transistor P4 is connected to the second pad 22, separated from the inner line VCC.

A bit line potential/capacitor plate potential control circuit 20 is provided for controlling the potentials of the bit line precharge line 16 and capacitor plate at the time of the voltage stress examination.

Specifically, the control circuit 20 turns off the bit line-precharge voltage-generating circuit 18 to transmit a bit line potential VBL, which is supplied from the outside to a third pad 23, to the bit line-precharge power source line 16. Further, the circuit 20 varies the potential of the output of the precharge voltage-generating circuit 18, or turns off the circuit 18 to connect the power source line 16 to a predetermined potential terminal (e.g. the VSS node).

To perform the above-described operations, the circuit 20 comprises a fourth pad 24, a resistor 31, CMOS inverters 32 and 33, and an output switch circuit 34.

Moreover, the control circuit 20 turns off the plate potential-generating circuit 19 to transmit a potential, which is supplied from the outside to a fifth pad 25, to the capacitor plate. The circuit 20 also varies the potential of the output of the plate potential-generating circuit 19, or turns off the circuit 19 to connect the capacitor plate to a predetermined potential terminal.

To perform these operations, the circuit 20 comprises the fourth pad 24, the resistor 31, the CMOS inverters 32 and 33, and an output switch circuit 35.

Instead of the bit line potential/capacitor plate potential control circuit 20, a bit line potential control circuit 20 and a capacitor plate potential control circuit, which operate independent of each other, may be employed.

The operation of the DRAM of FIG. 1 will now be explained.

During normal operation of the DRAM, the output of the bit line-precharge potential-generating circuit 18 is supplied to the bit line-precharge power source line 16. When a /RAS signal is inactivated (i.e., its level is shifted to "H"), a bit line-precharge signal-generating circuit (not shown) is activated and generates a precharge signal VEQ. Thus, all the bit line-precharge transistors 15 are turned on, thereby precharging all the bit lines (BL, /BL) to a predetermined bit line potential. At this time, the potential VSS is applied to the first pad 21, while the potential VCC is applied to the second pad 22. When the /RAS signal is activated (i.e., its level is shifted to "L"), the precharge signal VEQ to be supplied to the bit line of a memory cell block (memory cell array) selected by the address signals X0-X2 is inactivated, and word line-selecting signals for word lines corresponding to the logic level combination of the address signals are output, thereby selecting the word lines.

When the word line-driving circuit 14 is in a selected state, i.e., when a word line-selecting signal having "L" level for activation is supplied to the circuit 14, the output potential V1 of the first inverter IV1 is raised to "H" level, and the level of the connection node between the drain terminal of one of the transistors N4 and the gate terminal of the transistor N2 is shifted to "H". Thus, the driving transistor N2 is turned on, thereby raising the level of the word line WL to "H". At this time, the level of the output of the second CMOS inverter IV2 is shifted to "L", and the noise-eliminating transistor N3 is turned off. Further, the pull-up p-type MOS transistor P3 is turned off since the potential of its gate (i.e., the potential of the output of the first CMOS inverter IV1) is at "H" level.

On the other hand, when the word line-driving circuit 14 is in a non-selected state, i.e., when a word line-selecting signal having "H" level for inactivation is supplied to the circuit 14, the output potential V1 of the first inverter IV1 is shifted to "L" level, and the level of the connection node between the drain terminal of the one of the transistors N4 and the gate terminal of the transistor N2 is shifted to "L". Thus, the driving transistor N2 is turned off, thereby shifting the state of the word line WL to a non-selected state. At this time, the level of the output of the second CMOS inverter IV2 is shifted to "H", and the noise-eliminating transistor N3 is turned on. Further, the pull-up p-type MOS transistor P3 is turned on since the potential of its gate (i.e., the potential of the output of the first CMOS inverter IV1) is at "L" level.

To perform the voltage stress examination at the time of burn-in of the DRAM in a wafer stage, operation power voltages (VCC=e.g. 5 V; VSS=0 V) are applied thereto, and the /RAS input signal is inactivated (i.e., its level is shifted to "H"), thereby holding the DRAM in a waiting state. Accordingly, a bit line precharge/equalize signal-generating circuit (not shown) is activated and generates the precharge signal VEQ (alternatively, this circuit may be constructed such that it generates a control signal for activating the precharge signal VEQ). Thus, the bit line precharge transistor 15 is turned on. In the waiting state, the word line-selecting signal is at inactive level "H", the output potential V1 of the first inverter IV1 of the word line-driving circuit 14 is at "L" level, the level of the connection node between the drain terminal of the transistor N4 and the gate terminal of the transistor N2 is at "L", the driving transistor N2 is turned off, the word line WL is in a non-selected state, and the gates of the p-type MOS transistor P4 of the second CMOS inverter IV2 and the n-type MOS transistor N5 are at "L" level.

Thus, if the stress voltage VS is applied to the first pad 21, and the gate control voltage VG more than VS+Vth1 (Vth1 is a threshold voltage of the n-type MOS transistor N3) is applied to the second pad 22, the p-type MOS transistor P4 will be turned on and the noise-eliminating transistor N3 will be turned on to thereby apply a predetermined voltage stress to all the word lines WL (or word lines WL more than those selected in normal operation).

At this time, if the output switch circuit 34 of the precharge potential-generating circuit 18 is turned off by the control circuit 20, and if a predetermined voltage (e.g. VSS) is applied to the third pad 23, a predetermined voltage will be applied between each of the word lines WL and the bit lines, i.e., to the gate insulation film of the memory cell transistor 11.

In addition, if the output switch circuit 35 of the plate potential-generating circuit 19 is turned off by the control circuit 20, and a desired potential (e.g. VCC) is applied from the outside to the fifth pad 25, and if data "0" is written into each memory cell to thereby set the potential of the storage node of each capacitor 12, at substantially the same value as VSS, a voltage stress of about VCC-VSS will be applied to the insulation film of the capacitor. Alternatively, if data "1" is written into each memory cell in a state where a plate potential of VSS is applied, thereby setting the potential of the storage node of each capacitor 12 to about VCC, a voltage stress of about VCC-VSS will be applied to the insulation film of the capacitor.

Further, to perform normal operation at the time of subjecting the DRAM in a wafer stage, to a die-sorting test, the contact terminal (e.g. a probe of a probe card) of a tester is brought into contact with the pad to apply a desired voltage.

To relieve memory cells, obtained after screening through a burn-in test, by a redundancy circuit, thereby dicing the wafer to provide separate chips, and connecting the pad of a chip to an external terminal of a device, the first and second pads 21 and 22 are connected to the VSS node and VCC node, respectively (for example, by bonding the pads to inner leads of a lead frame for VSS and VCC), which enables the chip to perform, as in the conventional case, normal operation even after packaging thereof.

In the DRAM of FIG. 1, at the time of burn-in of the DRAM in a wafer stage, a voltage stress of direct current can be applied to all the word lines WL or to word lines more than those selected in a normal operation, thereby remarkably enhancing the efficiency of burn-in. In this case, the noise-eliminating transistor N3 is used as voltage stress transfer means, so that there is no pass current between the transistor N3 and earth node.

The noise-eliminating transistor N3 is controlled to be in an on-state at the time of the voltage stress examination so as to transfer a voltage stress input from pad 21 to a word line, whereas pad 21 is connected to the earth node and the MOS transistor N3 is controlled complementarily with the word line-driving transistor N2, at the time of normal operation. Thus, the transistor N3 is used both at the time of the voltage stress examination and at the time of normal operation. Accordingly, the area of each chip required for the voltage stress examination can be minimized.

FIG. 2 is a circuit diagram showing a variation of the circuit of FIG. 1.

In the circuit, a resistor R2 is connected between the first pad 21 and VSS node, and a resistor R1 is connected between the second pad 22 and VCC node.

With this structure, at the time of the voltage stress examination performed when the DRAM in a wafer stage is subjected to burn-in, current flows between the stress voltage source and VSS node and between the control voltage source and VCC node via the resistors R2 and R1, respectively. During normal operation, the potential of the first pad 21 is set to VSS, while the potential of the second pad 22 is set to VCC. Therefore, it is not necessary to contact probes of a probe card with the pads at the time of die-sorting. Thus, it is not necessary to bond the pads on e.g. lead frame in a wire-bonding process. Further, the circuit of FIG. 2 may be modified such that only one of the resistors R1 and R2 is incorporated.

As another variation of the circuit of FIG. 1, not only the source of the p-type MOS transistor P4 but also the sources of the other p-type MOS transistors P1-P3 may be connected to the second pad 22, rather than to the inner VCC lines. Further, a single n-type well, which is separated from n-type wells of other p-type MOS transistors, may be used as the common source of the transistors P1-P4.

Also in this structure, when the circuit is in a waiting state at the time of the voltage stress examination, the precharge signal PRCH and address signals X0-X2 are all at "L" level, so that there is no problem in the operation of the circuit.

In the DRAM of FIG. 1, the p-type MOS transistor P4 of the second CMOS inverter IV2 is supplied, at the time of the voltage stress examination, with "L" level voltage at its gate and with high voltage (control voltage VG) at its source, that is, the gate oxide film of the transistor P4 is supplied with an electric field of an intensity higher than required. Further, such a MOS transistor has its gate oxide film supplied with an electric field of an intensity higher than required will be formed also in the above-described variation of the DRAM of FIG. 1, in which the sources of the p-type MOS transistors P1-P4 are connected to the second pad 22, rather than to the inner VCC lines, and a single n-type well is used as the common source of the transistors P1-P4.

FIG. 3 shows part of a DRAM according to a second embodiment of the invention, which can solve the above problem.

The second embodiment differs from the first embodiment in the following points (a)-(d):

(a) The source and the substrate of the p-type MOS transistor P4 is connected not to the second pad 22, but to the VCC node.

(b) A CMOS transfer gate 36 is inserted between the second CMOS inverter IV2 and the gate of the noise-eliminating transistor N3. The transfer gate 36 has an n-type MOS transistor N8 whose gate is connected to the VCC node, and a p-type MOS transistor P5 whose substrate is connected to the second pad 22. An n-type MOS transistor N7 is inserted between the gate of the p-type MOS transistor P5 and first pad 21, and the gate of the transistor N7 is connected to the VCC node.

(c) A p-type MOS transistor P6 is added, which has a gate connected to the VCC node, a source and a substrate thereof connected to the second pad 22, and a drain connected to the gate of the noise-eliminating transistor N3.

(d) A p-type MOS transistor P7 is added, which has a gate connected to the VCC node, a source and a substrate thereof connected to the second pad 22, and a drain connected to the gate of the transistor P5.

The operation of the DRAM of FIG. 3 is basically similar to that of the DRAM of FIG. 1, except for the following:

At the time of the voltage stress examination performed when the device in a wafer stage is subjected to burn-in, the first pad 21 is supplied with the stress voltage VS as in the DRAM of FIG. 1. The gate control voltage VG to be applied to the second pad 22 must be set to a value satisfying formulas $VG > VS + Vth1$ (Vth1 is the threshold voltage of the n-type MOS transistor N3); and $VG > VCC + |Vth2|$ (Vth2 is the threshold voltage of the p-type MOS transistor P6).

At this time, if the DRAM is subjected to the voltage stress examination while being supplied with power for operation and hence being in a waiting state, a voltage stress higher than required is not applied to the transistors P5-P7, N7, and N8 for the following reasons: The output potential V1 of the second CMOS inverter IV2 is VCC, while the gate control voltage VG and stress voltage VS are higher than VCC. Thus, the gate potential V2 of the noise-eliminating transistor N3 and the gate potential V3 of the p-type MOS transistor P5 become equal to VG, thereby turning off the CMOS transfer gate 36. Further, the gate potential V3 is insulated from the stress voltage VS by an n-type MOS transistor N7.

On the other hand, during normal operation, if the VSS potential is applied to the first pad 21, and if the VCC potential is applied to the second pad 22, the CMOS transistor 36 will be turned on and the p-type MOS transistors P6 and P7 will be turned off, as in the DRAM of FIG. 1, so that the DRAM of FIG. 3 operates in a similar manner with the latter.

The transistors P5, P7, and N7 are provided for preventing, when the output potential V1 of the second CMOS inverter IV2 is VCC during normal operation, the gate potential V2 from being maintained at "H" level as a result of the noise-eliminating transistor N3 becoming in a floating state due to a reduction in the VCC potential, through they are not necessary at the time of the voltage stress examination and of normal operation.

The transistors P6, P7, and N7 can be commonly provided for the word line-driving circuits corresponding to all the word lines.

In addition, the DRAM of FIG. 3 can provide an advantage similar to that of the DRAM of FIG. 2, if the resistor R2 is connected between the first pad 21 and VSS node, and the resistor R1 is connected between the second pad 22 and VCC node, as is shown in FIG. 2.

Figure 4:
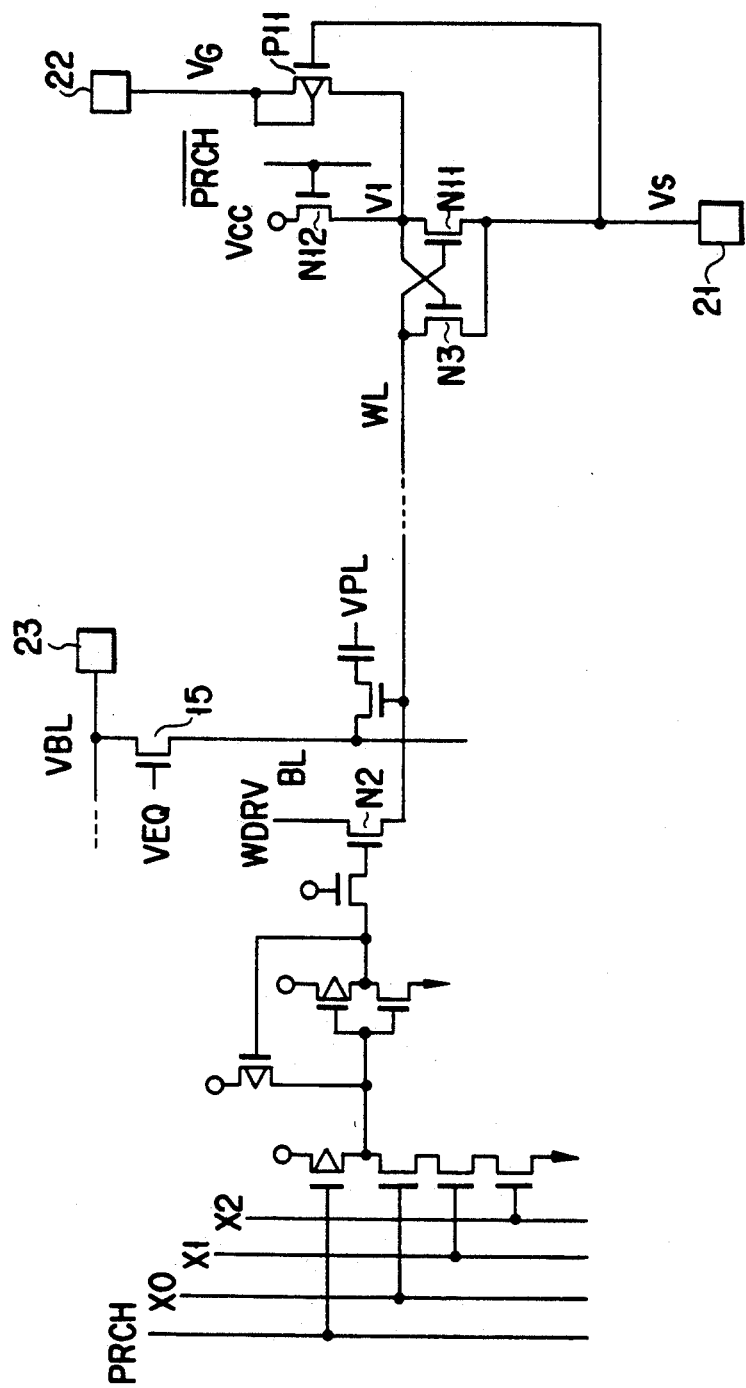
FIG. 4 is a circuit diagram, showing a part of a DRAM according to a second embodiment of the invention.

FIG. 4 is a circuit diagram showing a part of a DRAM according to a third embodiment of the invention.

In this DRAM, the noise-eliminating transistor N3 is connected between the VSS node and the other end of the word line WL (i.e., that end of the word line which is remote from the word line-driving circuit). Specifically, the first pad 21 is connected to the other end of the word line via the noise-eliminating transistor N3. The source of the transistor N3 is connected to the source of an n-type MOS transistor N11. The gate of the transistor N3 is connected to the drain of the transistor N11, while the gate of the transistor N11 is connected to the drain of the transistor N3. An n-type MOS transistor N12 is connected between the VCC node and the drain of the transistor N11, and has a gate supplied with an inverted precharge signal /PRCH. A p-type MOS transistor P11 is connected between the second pad 22 and the drain of the transistor N11, and the source and the substrate of the transistor P11 is connected in common. The gate of the transistor P11 is connected to the first pad 21.

The operation of the DRAM of FIG. 4 is basically similar to that of the DRAM of FIG. 1, except for the following:

At the time of the voltage stress examination performed when the device in a wafer stage is subjected to burn-in, the first pad 21 is supplied with the stress voltage VS, as in the DRAM of FIG. 1. The gate control voltage VG to be applied to the second pad 22 must be set to a value satisfying formulas VG > VS + Vth1 (Vth1 is the threshold voltage of the n-type MOS transistor N3); and VG > VCC + |Vth2| (Vth2 is the threshold voltage of the p-type MOS transistor P11).

At this time, if the DRAM is subjected to the voltage stress examination while being supplied with power for operation and hence being in a waiting state, the word line-driving transistor N2 is off as in the DRAM of FIG. 1, and the p-type MOS transistor P11 is on. Thus, the drain potential V1 of the transistor N11 is higher than VCC, and the inverted precharge signal /PRCH is at "H" level (VCC), so that an n-type MOS transistor N12 is off, the noise-eliminating transistor N3 is on (i.e., it is in a voltage stress-transfer state), and the transistor N11 is off. Further, since the substrate (i.e., n-type well generally biased at the VCC potential) of the transistor P11 is connected to the source thereof, the pn junction between the source and substrate will not be forward-biased even if the VG potential higher than the VCC potential is applied to the source.

During normal operation, the VSS potential is applied to the first pad 21, and the VCC potential is applied to the second pad 22, as in the DRAM of FIG. 1, the DRAM of FIG. 4 will operate in a similar manner with the latter. Specifically, in a precharge state, all the word lines are in the non-selected state, the converted precharge signal /PRCH is at "H" level (VCC), the drain potential of the transistor N11 is at "H" level (VCC), the noise-eliminating transistor N3 is on, and the transistor N11 is off. In a selected active memory cell block (memory cell array), the converted precharge signal /PRCH is at "L" level, and the transistor N12 is off. In a selected word line of the selected memory block, the drain potential of the transistor N11 is at "L" level, the transistor N11 is on, and the noise-eliminating transistor N3 is off. Further, in a non-selected word line of the selected memory block, the drain potential of the transistor N11 is at "H" level (VCC), the noise-eliminating transistor N3 is on, and the transistor N11 is off.

In a non-selected word line of a selected active memory cell block, when the converted precharge signal /PRCH is at "L" level (VSS), and the transistor N12 is off, if the drain of the transistor N11 is in a floating state, the drain potential V1 of the transistor N11 may become lower than the threshold voltage of the noise-eliminating transistor N3 due to current leakage or coupling, thereby turning off the transistor N3. To prevent this, the p-type MOS transistor P11 is provided to pull up the drain potential of the n-type MOS transistor N11. The transistor P11 also serves to prevent the drain potential V1 of the transistor N11 from being kept at "H" level when the potential of the VCC node becomes lower than "H" level in the precharge state or the like.

The size of the p-type MOS transistor P11 is determined so as to cause the transistor N11 to be turned on when the voltage in the word line is increased, thereby reducing the drain potential V1 of the transistor N11 to a value near VSS. That is, it is necessary to set the "On" resistance of the transistor P11 higher than that of the transistor N11 by e.g. sufficiently lengthening the gate length thereof, thereby causing the drain potential V1 of the transistor N11 to be lower than the threshold voltage of the noise-eliminating transistor N3, when the voltage in the word line is increased. Otherwise, the charge in the word line will leak to the earth node via the noise-eliminating transistor N3.

The transistor P11 may be replaced with a resistor having a high resistance.

The DRAM of FIG. 4 can provide an advantage similar to that of the DRAM of FIG. 2, if the resistor R2 is connected between the first pad 21 and VSS node, and the resistor R1 is connected between the second pad 22 and VCC node, as is shown in FIG. 2.

Figure 5:
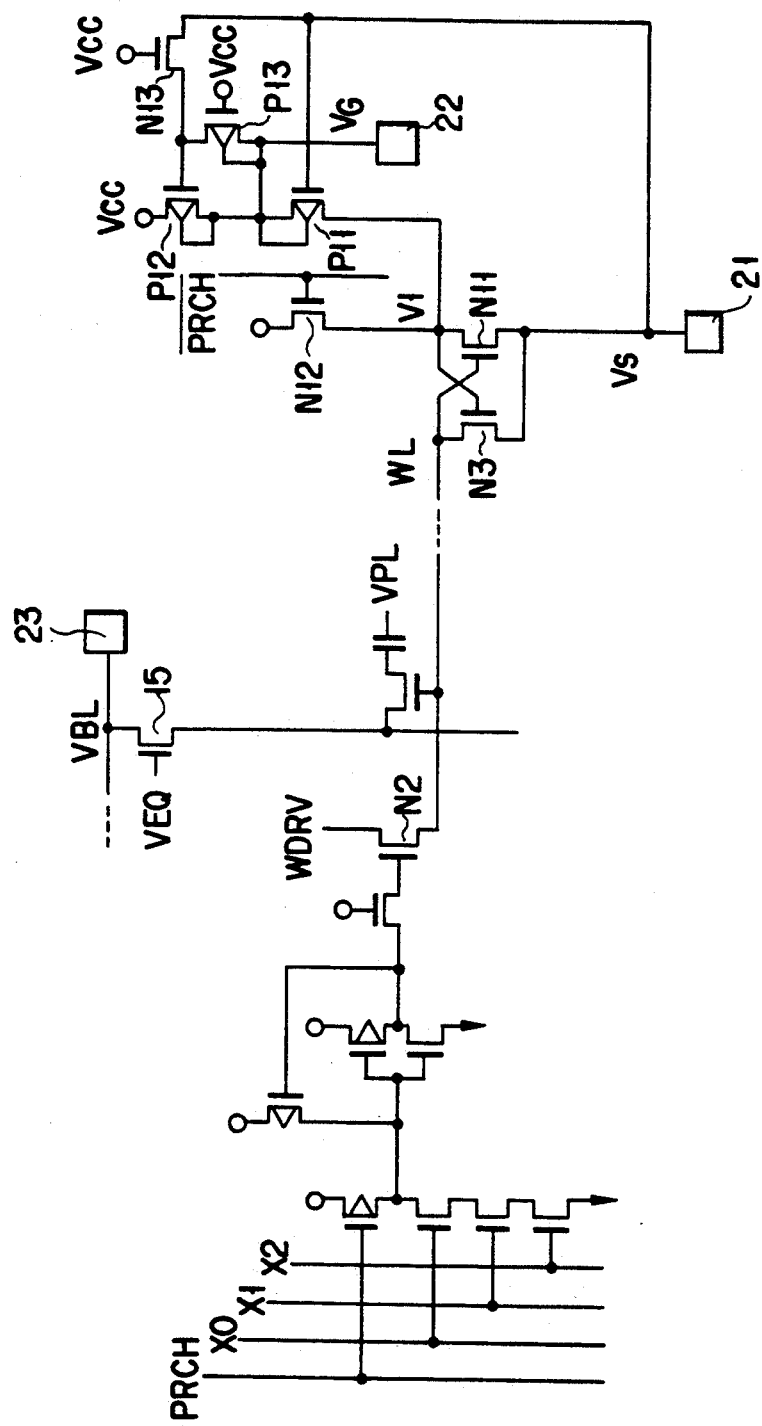
FIG. 5 is a circuit diagram, showing a variation of the circuit of FIG. 4.

FIG. 5 is a circuit diagram showing a variation of the circuit of FIG. 4.

The DRAM of FIG. 5 includes a p-type transistor P12, a p-type transistor P13, and an n-type transistor N13, as well as elements as incorporated in the DRAM of FIG. 4. The transistor P12 has its source and substrate connected to the second pad 22, and its drain connected to the VCC node. The transistor P13 has its source and substrate connected to the second pad 22, its drain connected to the gate of the transistor P12, and its gate connected to the VCC node. The transistor N13 is connected between the drain of the transistor P13 and the first pad 21, and has its gate connected to the VCC node.

The operation of the DRAM of FIG. 5 is basically similar to that of the DRAM of FIG. 4, except for the following:

At the time of the voltage stress examination performed when the device in a wafer stage is subjected to burn-in, the first pad 21 is supplied with the stress voltage VS, as in the DRAM of FIG. 4. The gate control voltage VG to be applied to the second pad 22 must be set to a value satisfying formulas VG>VS+Vth1, and VG>VCC+|Vth2|. At this time, if the DRAM is subjected to the voltage stress examination while being supplied with power for operation and hence being in a waiting state, the word line-driving transistor N2 is off as in the DRAM of FIG. 4, and the p-type MOS transistor P11 is on. Thus, the drain potential V1 of the transistor N11 is higher than VCC, and the inverted precharge signal /PRCH is at "H" level (VCC), so that the MOS transistors N12, P12, N11 and N13 are off, the transistor P13 is on, and the noise-eliminating transistor N3 is on (i.e., it is in a voltage stress-transfer state).

On the other hand, during normal operation, if the VSS potential is applied to the first pad 21 (the potential is supplied from a tester when the DRAM is in a wafer stage, and it is supplied from a VSS source pad, not shown, connected to the first pad 21 by bonding at the time of assembly of the DRAM), the transistor P13 will be turned off, and the transistor N13 will be turned on, thereby supplying a potential of "H" level from the VCC node via the transistors P12 and P11. Thus, the DRAM can operate in a similar manner with that of FIG. 4, even though no potentials are supplied to the second pad 22.

Also in this case, the "On" resistance of the p-type MOS transistor P11 must be set lower than that of the n-type transistor N11, so as to cause the drain potential V1 of the transistor N11 to be reduced to a value near VSS when the potential of the word line is increased and the transistor N11 is turned on. Further, the "On" resistance of the p-type MOS transistor P12 must be set lower than that of the p-type MOS transistor P11, so as to prevent current from flowing in the forward direction through the pn junction between the substrate (n-type well) of the transistor P12 and the drain of the same.

The transistors P12, P13, and N13 can be provided commonly for noise-eliminating circuits corresponding to all the word lines.

Figure 6:
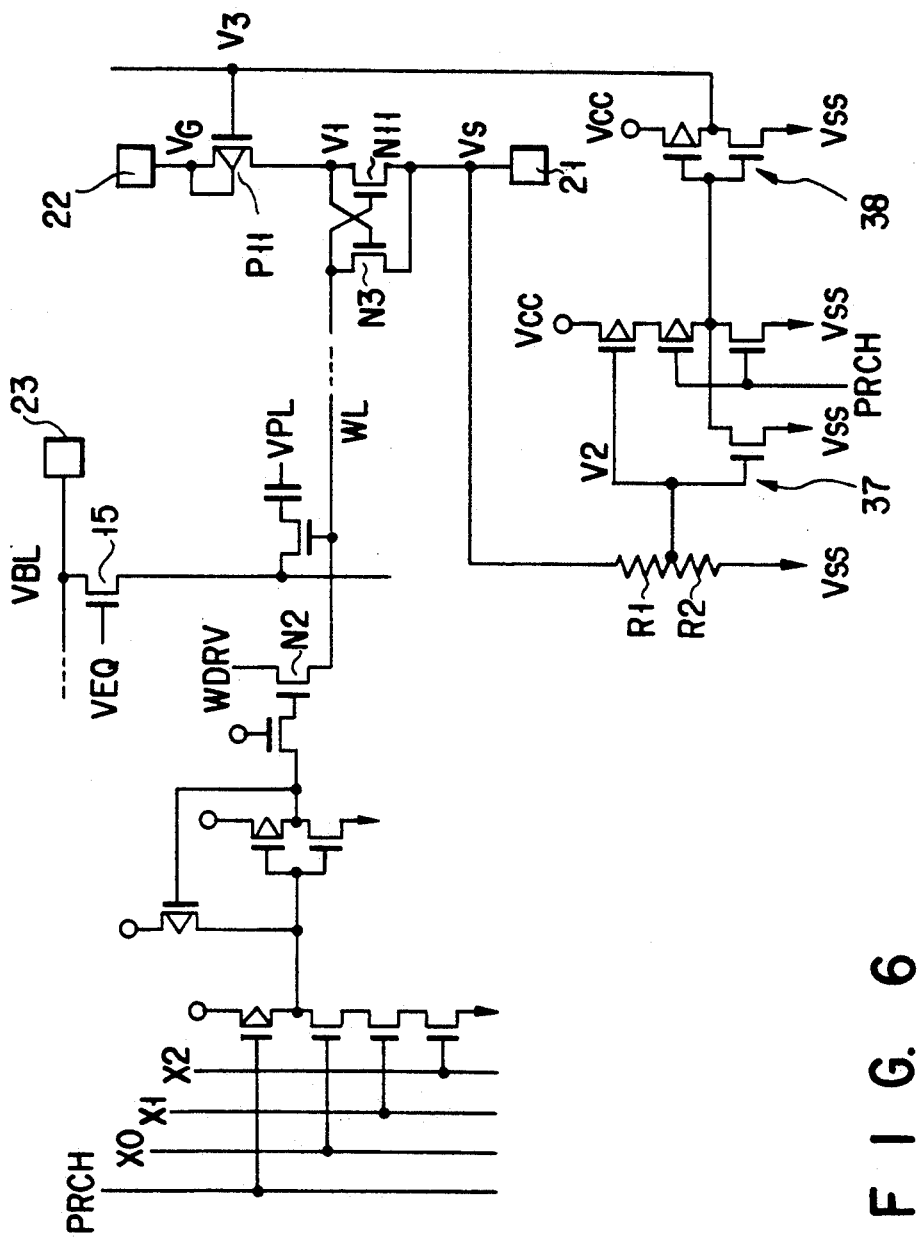
FIG. 6 is a circuit diagram, showing another variation of the circuit of FIG. 4.

FIG. 6 shows another variation of the device of FIG. 4, in which the precharge n-type MOS transistor N12 is not incorporated, and the drain potential V1 of the transistor N11 is in a floating state in a non-selected word line of a selected active memory block (memory cell array). That is, the DRAM of FIG. 6 differs from that of FIG. 4 in that a voltage distribution circuit (comprising e.g. resistors R1 and R2) is connected between the first pad 21 and the VSS node, that the output V2 of the voltage distribution circuit and the precharge signal PRCH are input to a NOR circuit 37 having two input terminals, that the output of the circuit 37 is input to a CMOS inverter 38, and that the output V3 of the inverter 38 is supplied to the gate of the p-type MOS transistor P11.

The operation of the DRAM of FIG. 6 is basically similar to that of the DRAM of FIG. 4, except for the following:

At the time of the voltage stress examination performed when the device in a wafer stage is subjected to burn-in, the first pad 21 is supplied with the stress voltage VS, as in the DRAM of FIG. 4. The gate control voltage VG to be applied to the second pad 22 must be set to a value satisfying formulas VG>VS+Vth1, and VG>VCC+|Vth2|. The resistances of the voltage distribution resistors R1 and R2 must be set to such values as to prevent the p-type MOS transistor and n-type MOS transistor, included in the NOR circuit 37, from being supplied with voltages higher than required, and as to enable these voltages to have "H" level, even when the high voltage VS is supplied to the NOR circuit 37. With this structure, the output of the NOR circuit 37 will have "L" level, and the output of the CMOS inverter 38 will have "H" level, thereby preventing the p-type MOS transistor P11 from being supplied with a voltage higher than required.

On the other hand, during normal operation, if the VSS potential is applied to the first pad 21, and if the VCC potential is applied to the second pad 22, as in the DRAM of FIG. 4, the DRAM of FIG. 6 can operate in a similar manner with the latter.

The resistors R1 and R2, NOR circuit 37, and CMOS inverter 38 can be provided commonly for noise-eliminating circuits corresponding to all the word lines.

Although in the above-described embodiments, each word line-selecting circuit 13 selects a corresponding one of the word lines WL, the invention may be modified such that one word line-selecting circuit 13 selects a plurality (e.g. four) of word lines WL, and that each word line-driving transistor N2 is supplied with a word line-driving voltage WDRV.

Moreover, in the embodiments, the voltage stress examination pad may serve as a bonding pad, or alternatively, it may have a structure to which a voltage can be applied by contacting it with that contact terminal of a tester, in a case where the DRAM in a wafer stage is subjected to burn-in. Further, in a case where the DRAM packaged after chips are separated from the wafer is subjected to burn-in, the voltage stress examination pad may have a structure which can be connected to wiring of an element outside at the time of packaging.

In addition, although in the embodiments, the voltage stress examination pad is provided on each chip in a wafer stage, at least one examination pad may be provided for a plurality of chips, and wires connecting the pad to the chips may be formed in e.g. a dicing line region.

Though the voltage stress examination at the time of burn-in is explained in the embodiments, it is a matter of course that the invention is effective also in a case where the voltage stress examination is performed without using a temperature-acceleration method.

The invention is not limited to the above embodiment, but may be modified without departing from the scope and spirit thereof.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A dynamic random access memory comprising:
    a plurality of dynamic memory cells arranged in rows and columns;
    a plurality of word lines each connected to the dynamic memory cells arranged in a corresponding one of the rows;
    a plurality of bit lines each connected to the dynamic memory cells arranged in a corresponding one of the columns; and a plurality of noise-eliminating circuits each having a first terminal connected to a corresponding one of the word lines, a second terminal connected to a node for supplying an earth voltage during a normal operation and a stress voltage during a stress test, and a transfer means, responsive to a first transfer signal for selectively transferring the stress voltage from the second terminal to the first terminal during a stress test, and responsive to a second transfer signal for selectively connecting the first terminal to the earth voltage during normal operation.

2. A dynamic random access memory comprising:

a plurality of dynamic memory cells arranged in rows and columns;

a plurality of word lines each connected to the dynamic memory cells arranged in a corresponding one of the rows;

a plurality of bit lines each connected to the dynamic memory cells arranged in a corresponding one of the columns;

a plurality of word line-selecting circuits each for outputting a word line-selecting signal in accordance with an address signal supplied from outside the dynamic random access memory or from an element incorporated in the dynamic random access memory;

a plurality of word line-driving circuits, each connected between a word line-driving power source and an end of a corresponding one of the word lines, for driving the corresponding word line in accordance with a signal output from a corresponding one of the word line-selecting circuits;

a plurality of bit line-precharge circuits each connected between a corresponding one of the bit lines and a bit line-precharge power source line, the bit line-precharge circuits being controlled by bit line-precharge signals;

a bit line-precharge voltage-generating circuit for supplying a bit line-precharge voltage to the bit line-precharge power source line; and a plurality of noise-eliminating circuits each having a first terminal connected to a corresponding one of the word lines, a second terminal connected to a node for supplying an earth voltage during a normal operation and a stress voltage during a stress test, and a transfer means, responsive to a first transfer signal for selectively transferring the stress voltage from the second terminal to the first terminal during a stress test, and responsive to an output of a corresponding one of the word line-selecting circuits during a normal operation for selectively connecting the first terminal to the earth voltage.

3. The dynamic random access memory according to claim 1, further comprising a third terminal connected to the second terminal of all of the noise-eliminating circuits, the third terminal being supplied with the stress voltage from outside the dynamic random access memory at the time of the stress test.

4. The dynamic random access memory according to claim 2, further comprising a third terminal connected to the second terminal of all of the noise-eliminating circuits, the third terminal being supplied with the stress voltage from outside the dynamic random access memory at the time of the stress test.

5. The dynamic random access memory according to claims 3 or 4, further comprising a resistor element connected between the third terminal and the earth voltage.

6. The dynamic random access memory according to any one of claims 1 to 4, further comprising a fourth terminal for supplying a control voltage for turning on the noise-eliminating circuits.

7. The dynamic random access memory according to claim 6, further comprising a resistor element connected between the fourth terminal and a power source potential node, and a resistor element connected between the third terminal and the earth voltage.

8. The dynamic random access memory according to claim 5, further comprising a fourth terminal for supplying a control voltage for turning on the noise-eliminating circuits.

9. The dynamic random access memory according to claim 8, further comprising a resistor element connected between the fourth terminal and a power source potential node.

10. The dynamic random access memory according to claim 1, further comprising a bit line potential control means for controlling a potential of a bit line-precharge power line at the time of the voltage stress test.

11. The dynamic random access memory according to claims 2 or 4, further comprising a bit line potential control means for controlling a potential of the bit line-precharge power source line at the time of the stress test.

12. The dynamic random access memory according to claim 11, wherein the bit line potential control means turns off the bit line-precharge voltage-generating circuit at the time of the stress test, thereby transmitting a bit line potential, supplied from outside the dynamic random access memory, to the bit line-precharge power line, or turns off the bit line precharge voltage-generating circuit, thereby connecting the bit line-precharge power source line to a predetermined potential terminal.

13. The dynamic random access memory according to claim 12, further comprising a plate potential-generating circuit for supplying a plate potential to a capacitor plate of the dynamic memory cells, and plate potential control means for controlling the output of the plate potential-generating circuit at the time of the stress test.

14. The dynamic random access memory according to claim 13, wherein the plate potential control means turns off, at the time of the stress test, the plate potential-generating circuit, thereby transmitting the plate potential, input from outside the dynamic random access memory, to the capacitor plate of the dynamic memory cells, or turns off, at the time of the stress test, the plate potential-generating circuit, thereby connecting the capacitor plate to a predetermined potential terminal.

15. A semiconductor memory device, comprising:
memory cells arranged in a row and column array;
word lines each connecting memory cells in a respective row of said array;
bit lines each connecting memory cells in a respective column of said array;
nodes each supplying an earth voltage during a normal operation of said semiconductor memory device and a stress voltage during a stress test operation of said semiconductor memory device;
word line driving circuits each connected to a corresponding one of said word lines and including driving means responsive to word line selecting signals for selectively driving the corresponding word line, a noise-eliminating circuit connected between one of said nodes and the corresponding word line, and control means, responsive to the word line selecting signals during the normal operation for selectively coupling the corresponding word line to the earth voltage and responsive to a stress test signal during the stress test operation for coupling the corresponding word line to the stress voltage; and word line selecting circuits coupled to said word line driving circuits, said word line selecting circuits responsive to address data during the normal operation for generating word line selection signals supplied to said driving means.

16. The semiconductor memory device according to claim 15, wherein said noise-eliminating circuit comprises a transistor having a first terminal connected to the corresponding one of said word lines, a second terminal connected to one of said nodes, and a control terminal.

17. The semiconductor memory device according to claim 15, wherein said nodes comprise a pad for contacting probes of a probe card.

18. The semiconductor memory device according to claim 15, wherein said nodes comprise a pad connected to an earth potential for contacting probes of a probe card.

19. A dynamic random access memory comprising:
a plurality of dynamic memory cells arranged in rows and columns;
a plurality of word lines each connected to the dynamic memory cells arranged in a corresponding one of the rows;
a plurality of bit lines each connected to the dynamic memory cells arranged in a corresponding one of the columns;
a plurality of word line-selecting circuits each for outputting a word line-selecting signal in accordance with an address signal supplied from outside the dynamic random access memory or from an element incorporated in the dynamic random access memory;
a plurality of word line-driving circuits, each connected between a word line-driving power source and an end of a corresponding one of the word lines, for driving the corresponding word line in accordance with a signal output from a corresponding one of the word line-selecting circuits;
a plurality of bit line-precharge circuits each connected between a corresponding one of the bit lines and a bit line-precharge power source line, the bit line-precharge circuits being controlled by bit line-precharge signals;
a bit line-precharge voltage-generating circuit for supplying a bit line-precharge voltage to the bit line-precharge power source line; and
a plurality of noise-eliminating circuits each having a first terminal connected to a corresponding one of the word lines, a second terminal connected to a node for supplying an earth voltage during a normal operation and a stress voltage during a stress test, and a transfer means, responsive to a stress test signal and a precharge signal, for selectively transferring the stress voltage from the second terminal to the first terminal during the stress test and selectively connecting the first terminal to the earth voltage during the normal operation.

* * * * *

UNITED STATES PATENT AND TRADEMARK OFFICE
CERTIFICATE OF CORRECTION

PATENT NO. : 5,282,167
DATED : January 25, 1994
INVENTOR(S) : Hiroaki Tanaka et al It is certified that error appears in the above-indentified patent and that said Letters Patent is hereby corrected as shown below:

Column 13, Claim 2, lines 48-49, delete "first transfer" and insert —stress test—.

Signed and Sealed this

Thirty-first Day of May, 1994

*Attest:*

BRUCE LEHMAN

*Attesting Officer*     *Commissioner of Patents and Trademarks*